(12) United States Patent
Lin

(10) Patent No.: US 10,481,197 B2
(45) Date of Patent: Nov. 19, 2019

(54) CIRCUIT BOARD TESTING DEVICE AND CHASSIS FOR SAME

(71) Applicant: NANNING FUGUI PRECISION INDUSTRIAL CO., LTD., Nanning (CN)

(72) Inventor: Sheng-Yen Lin, New Taipei (TW)

(73) Assignee: NANNING FUGUI PRECISION INDUSTRIAL CO., LTD., Nanning (CN)

( * ) Notice: Subject to any disclaimer, the term of this patent is extended or adjusted under 35 U.S.C. 154(b) by 282 days.

(21) Appl. No.: 15/391,801

(22) Filed: Dec. 27, 2016

(65) Prior Publication Data
US 2018/0180663 A1    Jun. 28, 2018

(51) Int. Cl.
*G01R 31/28*    (2006.01)

(52) U.S. Cl.
CPC ................ *G01R 31/2806* (2013.01)

(58) Field of Classification Search
CPC .......... G06F 1/00; G06F 2101/00; G05B 1/00
See application file for complete search history.

(56) References Cited

U.S. PATENT DOCUMENTS

| | | | | |
|---|---|---|---|---|
| 5,611,436 A * | 3/1997 | Ashby | ................. | B07C 5/344 |
| | | | | 209/573 |
| 6,331,933 B1 * | 12/2001 | Rumney | ................. | G06F 1/184 |
| | | | | 174/541 |
| 2003/0062888 A1 * | 4/2003 | Magliocco | ....... | G01R 31/31903 |
| | | | | 324/750.08 |
| 2009/0273351 A1 * | 11/2009 | Cheng | ................. | G01R 1/0433 |
| | | | | 324/537 |
| 2013/0213113 A1 * | 8/2013 | Huang | ................. | G01M 7/08 |
| | | | | 73/12.13 |
| 2014/0306728 A1 * | 10/2014 | Arena | ................. | G01R 31/2808 |
| | | | | 324/750.08 |

FOREIGN PATENT DOCUMENTS

| | | |
|---|---|---|
| CN | 101668413 A | 3/2010 |
| CN | 101777296 A | 7/2010 |
| CN | 105314422 A | 2/2016 |
| TW | M323620 | 12/2007 |
| TW | 201027647 A1 | 7/2010 |
| TW | 201502545 A | 1/2015 |

* cited by examiner

*Primary Examiner* — Huy Q Phan
*Assistant Examiner* — Temilade S Rhodes-Vivour
(74) *Attorney, Agent, or Firm* — ScienBiziP, P.C.

(57) ABSTRACT

A circuit board testing device able to apply tests to the front and reverse surfaces of the circuit board includes a control unit, at least one testing unit, and a chassis. The chassis includes a bottom frame, a plug member slidably mounted to the bottom frame, a side frame connected to an edge of the bottom frame and a back plate which includes at least two installation parts. The back plate is fixed to the side frame, and the testing unit is installed to the chassis. A chassis is also disclosed.

13 Claims, 4 Drawing Sheets

CIRCUIT BOARD TESTING DEVICE AND CHASSIS FOR SAME

FIELD

The subject matter herein generally relates to a circuit board testing device and chassis used in the circuit board testing device.

BACKGROUND

After being assembled, circuit boards need to be tested to ensure quality. Some tests are applied to a front surface of the circuit board while other tests need to make contact with other points located on a back surface of the motherboard. When being tested, the circuit board is usually brought into contact with a plurality of fittings (such as power source, hard disk drive or heat sink) to identify whether the circuit board works properly.

BRIEF DESCRIPTION OF THE DRAWINGS

Implementations of the present technology will now be described, by way of example only, with reference to the attached figures.

DETAILED DESCRIPTION

Figure 1:
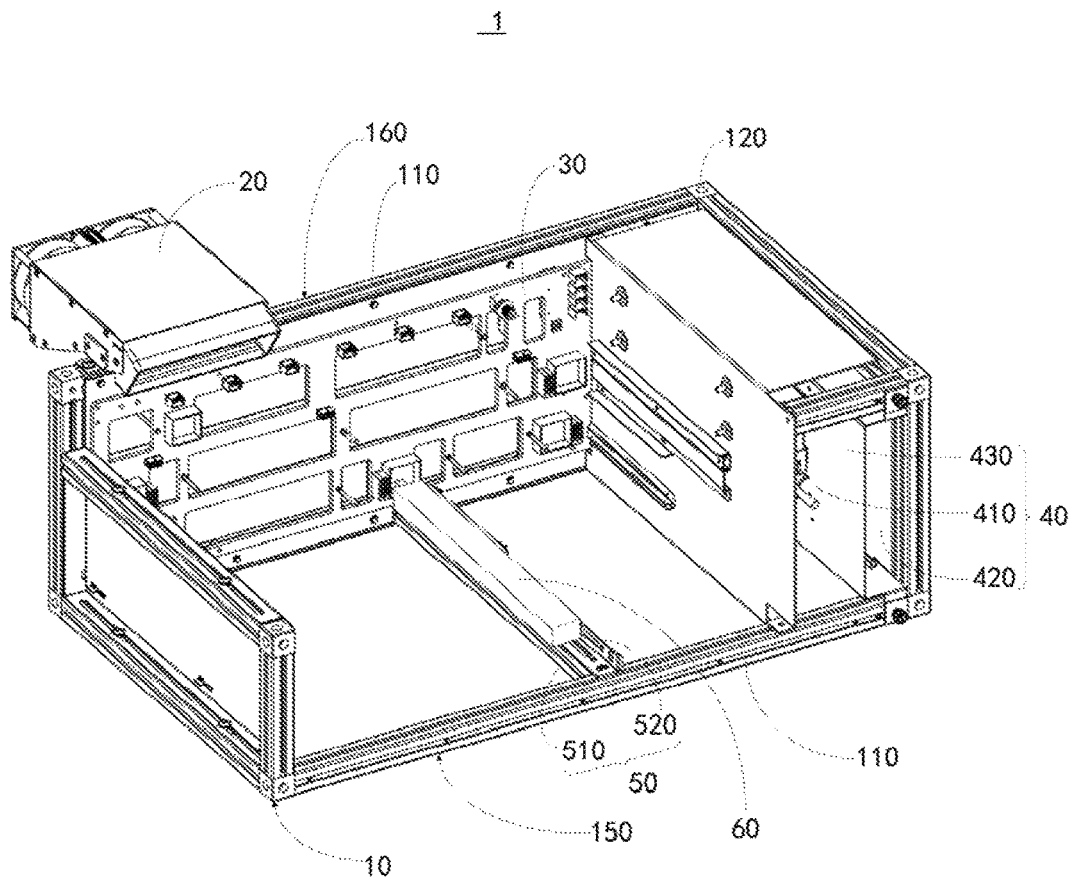
FIG. 1 is an isometric view of an exemplary embodiment of a circuit board testing device.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

Figure 2:
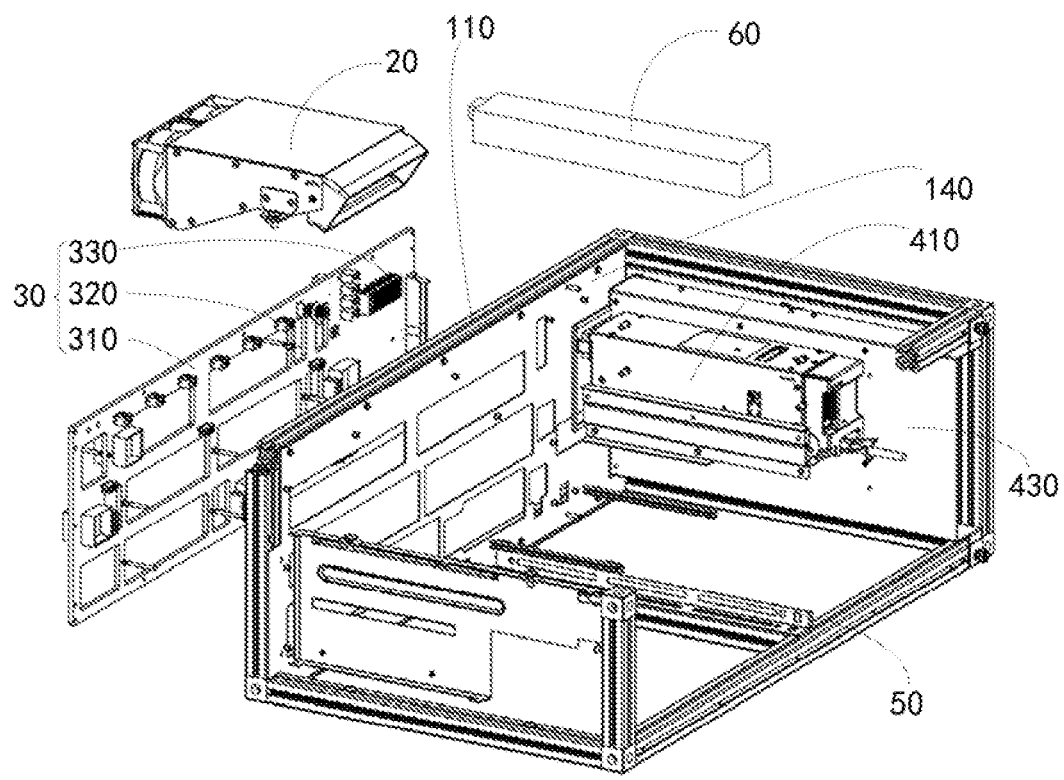
FIG. 2 is an exploded view of the circuit board testing device of FIG. 1.

FIGS. 1 and 2 illustrate an exemplary embodiment of a circuit board testing device 1.

The circuit board testing device 1 can include a chassis 10, a testing unit 60, and a control unit 40. The testing unit 60 and the control unit 40 are mounted to the chassis 10.

The chassis 10 can include a bottom frame 150, a side frame 160, and a back plate 140. The side frame 160 is perpendicularly connected to an edge of the bottom frame 150. The back plate 140 is fixed to the side frame 160. The back plate 140 can include two installation parts (not shown) through which a circuit board 30 can be installed to the back plate 140, the two installation parts can be symmetrically distributed on the back plate 140. Since screw holes on the circuit board 30 are usually symmetrically distributed, the circuit board 30 can be installed to the back plate 140 through a combination of installation parts and screw holes, tests can be carried out on some points located on a front surface of the circuit board 30, and then the circuit board 30 can be turned over and installed to the back plate 140 through a combination of the same installation parts and screw holes, so that other tests can be carried out on other points located on a back surface of the circuit board 30.

A plug member 50 can be slidably mounted to the bottom frame 150. The testing unit 60 can be fixed to the plug member 50 so that the testing unit 60 can slide along the bottom frame 150 together with the plug member 50. This enables adjustment of the relative location of the testing unit 60 and the circuit board 30 to fit the testing unit 60 to a required testing point.

In at least one exemplary embodiment, each of the bottom frame 150 and the side frame 160 can be a rectangular frame enclosed by supporting poles 110. For example, the bottom frame 150 can be a rectangular frame made up of four supporting poles 110 end to end, joints between the ends can be locked by lock members 120. The side frame 160 shares a supporting pole 110 with the bottom frame 150 and further includes three other supporting poles 110. Two of the three other supporting poles 110 are perpendicularly connected to two ends of the shared supporting pole 110, the third supporting pole 110 encloses the side frame 160. Two opposite ends of the plug member 50 can be slidably connected to two parallel supporting poles 110 of the bottom frame 160.

In at least one exemplary embodiment, each of the supporting poles 110 can be rectangular. The supporting pole 110 can include two opposite end surfaces and four side surfaces connected between the two opposite end surfaces, each of the four side surfaces defines a clamping slot 1101 along an extending direction of the supporting pole 110.

Figure 4:
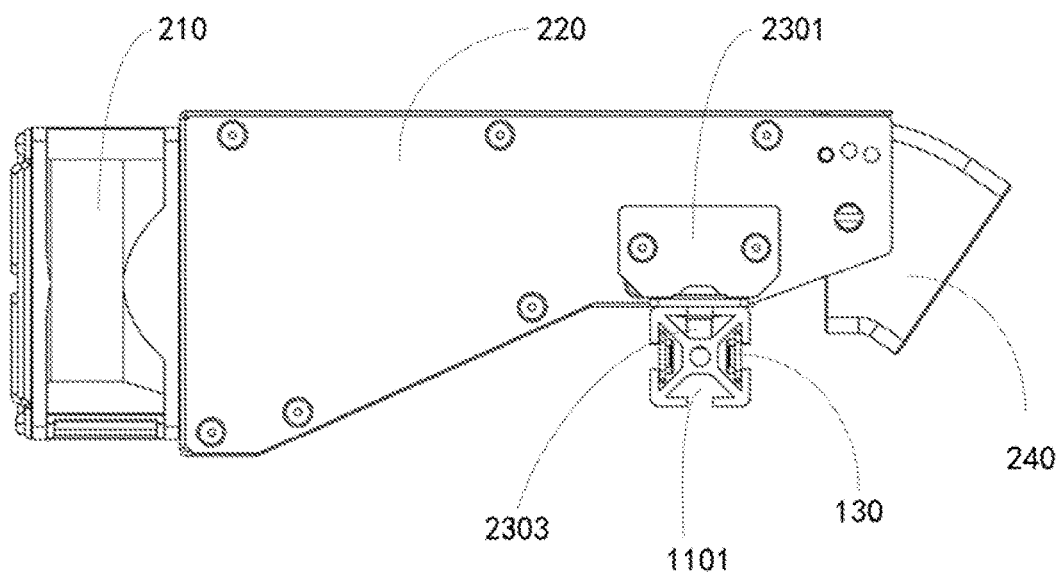
FIG. 4 is a side view of the cooling member and a strut of the device of FIG. 1.

Referring to FIG. 4, the back plate 140 can be fixed to the side frame 160 through an installation piece 130. For example, screw holes can be defined on the back plate 140 and on the installation piece 130. The installation piece 130 can be clamped into the clamping slot 1101 of a supporting hole 110 of the side frame 160, then the back plate 140 can be mounted to the installation piece 130 with screws.

The plug member 50 can include a sliding bar 510 and a connector 520 detachably connected to the sliding bar 510. The sliding bar 510 can include two clamping parts (not shown) positioned on opposite ends of the sliding bar 510, the ends of the sliding bar 510 are respectively and slidably connected to a clamping slot 1101 of two parallel supporting poles 110 of the bottom frame 150 through the two clamping parts. The shape of the sliding bar 510 can be the same as that of the supporting poles 110.

The connector 520 can include two plug boards perpendicularly connected to each other. The connector 520 can be selectively connected to the sliding bar 510 through one of the two plug boards. In detail, the two plug boards can be a first plug board and a second plug board perpendicularly connected to the first plug board. The connector 520 can be connected to the sliding bar 510 through the first plug board, and the testing unit 60 can be mounted to the second plug board. Alternatively, the connector 520 can be rotated 90 degrees, and the connector 520 can be connected to the sliding bar 510 through the second plug board allowing the testing unit 60 to be mounted to the first plug board.

The control unit can include a power source 410, a control board 420 electrically connected to the power source 410, and a heat dissipation channel 430 formed between the power source 410 and the control board 420. The control board 420 can share the cooling fan of the power source 410.

Figure 3:
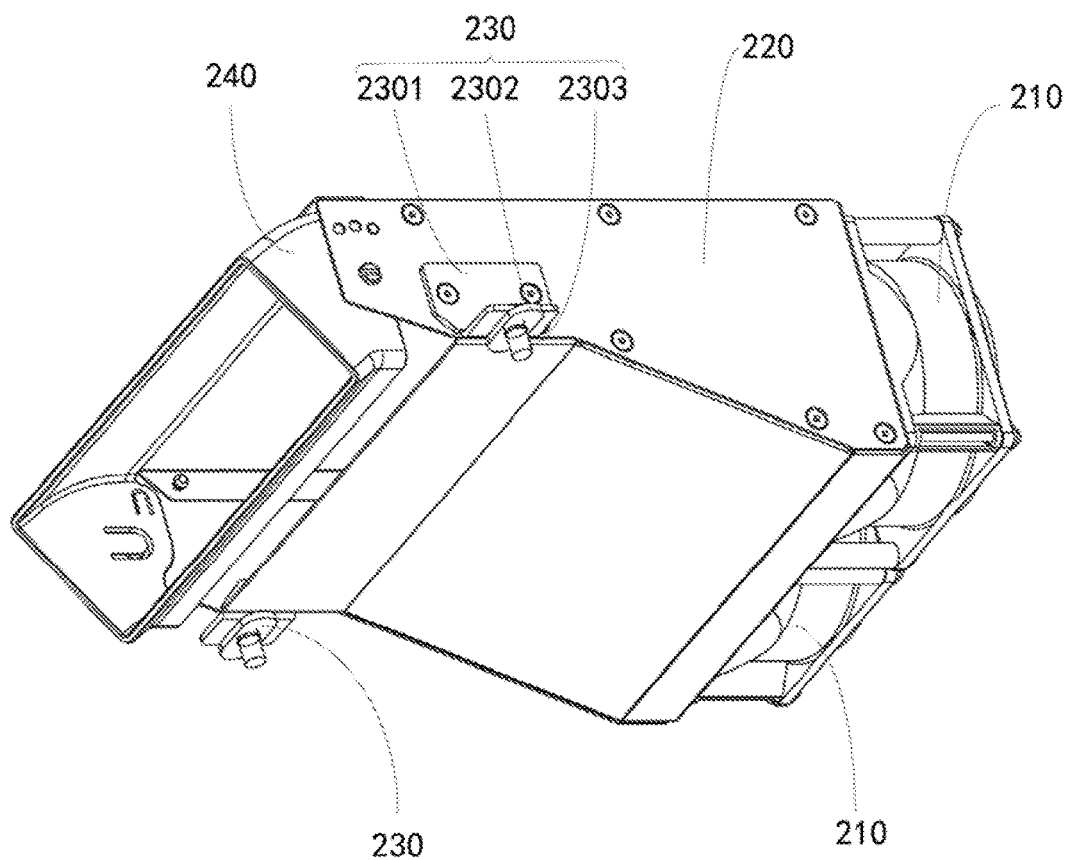
FIG. 3 is an isometric view of a cooling member of the device of FIG. 1.

Referring to FIGS. 3 and 4, the circuit board testing device 1 can further include a cooling member 20 movably installed to an upper side of the side frame 160.

The cooling member 20 can include at least one cooling fan 210, a wind scooper 240, a wind leading channel 220, and a slider 230 connected under the wind leading channel 220. The wind leading channel 220 is interconnected between the cooling fan 210 and the wind scooper 240. A sliding slot 1101 is defined on the upper side of the side frame 160 to receive the slider. The wind scooper 240 can be rotatably connected to an outlet end of the wind leading channel 220 to adjust the outlet direction of cooling wind produced by the fan 210.

The slider 230 can include a guiding piece 2302 and a connecting piece 2301. The guiding piece 2302 extends along the direction of the sliding slot 1101 and is received in the sliding slot 1101 defined on the upper side of the side frame 160. The connecting piece 2301 is connected between the wind leading channel 220 and the guiding piece 2302.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. A circuit board testing device comprising:
   a control unit;
   at least one testing unit; and
   a chassis comprising:
      a bottom frame;
      a plug member slidably mounted to the bottom frame;
      a side frame connected to an edge of the bottom frame; and
      a back plate comprising at least two symmetrical installation parts;
   wherein the back plate is fixed to the side frame, the testing unit is installed to the chassis through the at least two symmetrical installation parts;
   wherein each of the bottom frame and the side frame is a rectangular frame defined by supporting poles, each of the two opposite ends of the plug member are slidably connected to each of the two parallel supporting poles of the bottom frame;
   wherein each of the supporting poles is rectangular shaped, each of the supporting poles comprises two opposite end surfaces and four side surfaces connected between the two opposite end surfaces, each of the four side surfaces defines a clamping slot, two opposite ends of the plug member are respectively and slidably connected to a clamping slot of two parallel supporting poles of the bottom frame;
   wherein the plug member comprises:
      a sliding bar comprising two clamping parts on two opposite ends of the sliding bar; and
      a connector detachably connected to the sliding bar;
      the two opposite ends of the sliding bar are respectively and slidably connected to a clamping slot of the two parallel supporting poles of the bottom frame through the two clamping parts.

2. The circuit board testing device of claim 1, wherein the connector comprises two plug boards perpendicularly connected to each other, the connector selectively connected to the sliding bar through one of the two plug boards.

3. The circuit board testing device of claim 1, further comprising a cooling member slidably connected to an upper side of the side frame.

4. The circuit board testing device of claim 3, wherein the cooling member comprises:
   at least one cooling fan;
   a wind scooper comprising a slider; and
   a wind leading channel interconnected between the cooling fan and the wind scooper;
   a sliding slot is defined on the upper side of the side frame to receive the slider.

5. The circuit board testing device of claim 4, wherein the slider comprises:
   a guiding piece extending along a direction of the sliding slot and being received in the sliding slot; and
   a connecting piece connected between the wind leading channel and the guiding piece.

6. The circuit board testing device of claim 4, wherein the wind scooper is rotatably connected to an outlet end of the wind leading channel.

7. The circuit board testing device of claim 1, wherein the control unit comprises:
   a power source;
   a control board electrically connected to the power source; and
   a heat dissipation channel formed between the power source and the control board.

8. A chassis used in a circuit board testing device for a testing unit, the chassis comprising:
   a bottom frame;
   a plug member slidably mounted to the bottom frame;
   a side frame connected to an edge of the bottom frame; and
   a back plate comprising at least two symmetrical installation parts;
   wherein the back plate is fixed to the side frame, the testing unit is installed to the chassis through the at least two symmetrical installation parts;
   wherein each of the bottom frame and the side frame is a rectangular frame defined by supporting poles, each of the two opposite ends of the plug member are slidably connected to each of the two parallel supporting poles of the bottom frame;
   wherein each of the supporting poles is rectangular shaped, each of the supporting poles comprises two opposite end surfaces and four side surfaces connected between the two opposite end surfaces, each of the four side surfaces defines a clamping slot, two opposite ends of the plug member are respectively and slidably connected to a clamping slot of two parallel supporting poles of the bottom frame;
   wherein the plug member comprises:

a sliding bar comprising two clamping parts on two opposite ends of the sliding bar; and a connector detachably connected to the sliding bar;

the two opposite ends of the sliding bar are respectively and slidably connected to a clamping slot of the two parallel supporting poles of the bottom frame through the two clamping parts.

9. The chassis of claim 8, wherein the connector comprises two plug boards perpendicularly connected to each other, the connector selectively connected to the sliding bar through one of the two plug boards.

10. The chassis of claim 8, further comprising a cooling member slidably connected to an upper side of the side frame.

11. The chassis of claim 10, wherein the cooling member comprises:

at least one cooling fan;

a wind scooper comprising a slider; and a wind leading channel interconnected between the cooling fan and the wind scooper;

a sliding slot is defined on the upper side of the side frame to receive the slider.

12. The chassis of claim 11, wherein the slider comprises:

a guiding piece extending along a direction of the sliding slot and being received in the sliding slot; and a connecting piece connected between the wind leading channel and the guiding piece.

13. The chassis of claim 11, wherein the wind scooper is rotatably connected to an outlet end of the wind leading channel.

\* \* \* \* \*